(12) United States Patent
Hsu et al.

(10) Patent No.: US 10,756,736 B2
(45) Date of Patent: Aug. 25, 2020

(54) FUSED VOLTAGE LEVEL SHIFTING LATCH

(71) Applicant: Intel Corporation, Santa Clara, CA (US)

(72) Inventors: Steven K. Hsu, Lake Oswego, OR (US); Amit Agarwal, Hillsboro, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/335,092

(22) PCT Filed: Aug. 30, 2017

(86) PCT No.: PCT/US2017/049373
§ 371 (c)(1),
(2) Date: Mar. 20, 2019

(87) PCT Pub. No.: WO2018/063712
PCT Pub. Date: Apr. 5, 2018

(65) Prior Publication Data
US 2019/0280693 A1    Sep. 12, 2019

Related U.S. Application Data

(63) Continuation of application No. 15/277,189, filed on Sep. 27, 2016, now abandoned.

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01); *H03K 3/0372* (2013.01);
(Continued)

(58) Field of Classification Search
CPC ..... H03K 19/01855; H03K 19/018514; H03K 19/018528; H03K 19/018521
See application file for complete search history.

(56) References Cited

U.S. PATENT DOCUMENTS

| 5,767,728 A | 6/1998 | Michail et al. |
| 6,351,173 B1 | 2/2002 | Ovens et al. |

(Continued)

FOREIGN PATENT DOCUMENTS

| JP | 2013187602 A | 9/2013 |
| KR | 1020110074352 A | 6/2011 |

(Continued)

OTHER PUBLICATIONS

"U.S. Appl. No. 15/277,189, Advisory Action dated Jul. 20, 2018", 3 pgs.

(Continued)

*Primary Examiner* — Thomas J. Hiltunen
(74) *Attorney, Agent, or Firm* — Schwegman Lundberg & Woessner, P.A.

(57) ABSTRACT

Some embodiments include apparatus and methods using an input stage and an output stage of a circuit. The input stage operates to receive an input signal and a clock signal and to provide an internal signal at an internal node based at least in part on the input signal. The input signal has levels in a first voltage range. The internal signal has levels in a second voltage range greater than the first voltage range. The output stage operates to receive the internal signal, the clock signal, and an additional signal generated based on the input signal. The output stage provides an output signal based at least in part on the input signal and the additional signal. The output signal has a third voltage range greater than the first voltage range.

19 Claims, 5 Drawing Sheets

(52) U.S. Cl.
CPC ............... *H03K 19/01855* (2013.01); *H03K 19/018514* (2013.01); *H03K 19/018528* (2013.01)

(56) References Cited

U.S. PATENT DOCUMENTS

| | | | |
|---|---|---|---|
| 6,683,485 B1 | 1/2004 | Wert et al. | |
| 6,781,411 B2 * | 8/2004 | Steiss ................. | H03K 3/012 326/46 |
| 7,132,856 B2 | 11/2006 | Hsu et al. | |
| 7,656,718 B2 * | 2/2010 | Jeong ................. | G11C 7/1051 365/189.05 |
| 7,839,171 B1 * | 11/2010 | Miles ................. | H03K 3/011 326/63 |
| 8,493,125 B2 | 7/2013 | Kikuchi | |
| 8,520,428 B2 | 8/2013 | Helder et al. | |
| 8,575,962 B2 | 11/2013 | Yang et al. | |
| 8,901,964 B2 * | 12/2014 | Luo ................. | H03K 19/0013 326/112 |
| 9,069,652 B2 | 6/2015 | Yeung et al. | |
| 9,536,578 B2 * | 1/2017 | Jung ................. | G11C 7/12 |
| 2005/0285624 A1 | 12/2005 | Hsu et al. | |
| 2006/0290404 A1 | 12/2006 | Law | |
| 2013/0271199 A1 | 10/2013 | Hsu et al. | |
| 2014/0304475 A1 | 10/2014 | Ramanujan et al. | |
| 2014/0368236 A1 | 12/2014 | Chromczak | |
| 2015/0228314 A1 | 8/2015 | Bai et al. | |
| 2016/0285439 A1 | 9/2016 | Xie et al. | |
| 2018/0091150 A1 | 3/2018 | Hsu et al. | |

FOREIGN PATENT DOCUMENTS

| | | |
|---|---|---|
| KR | 1020120051562 A | 5/2012 |
| WO | WO-2018063712 A1 | 4/2018 |

OTHER PUBLICATIONS

"U.S. Appl. No. 15/277,189, Final Office Action dated Mar. 9, 2018", 17 pgs.

"U.S. Appl. No. 15/277,189, Non Final Office Action dated Oct. 5, 2017", 23 pgs.

"U.S. Appl. No. 15/277,189, Response filed Jan. 4, 2018 to Non Final Office Action dated Oct. 5, 2017", 12 pgs.

"U.S. Appl. No. 15/277,189, Response filed Jun. 6, 2018 to Final Office Action dated Mar. 9, 2018", 11 pgs.

"International Application Serial No. PCT/US2017/049373, International Search Report dated Dec. 11, 2017", 3 pgs.

"International Application Serial No. PCT/US2017/049373, Written Opinion date Dec. 11, 2017", 6 pgs.

\* cited by examiner

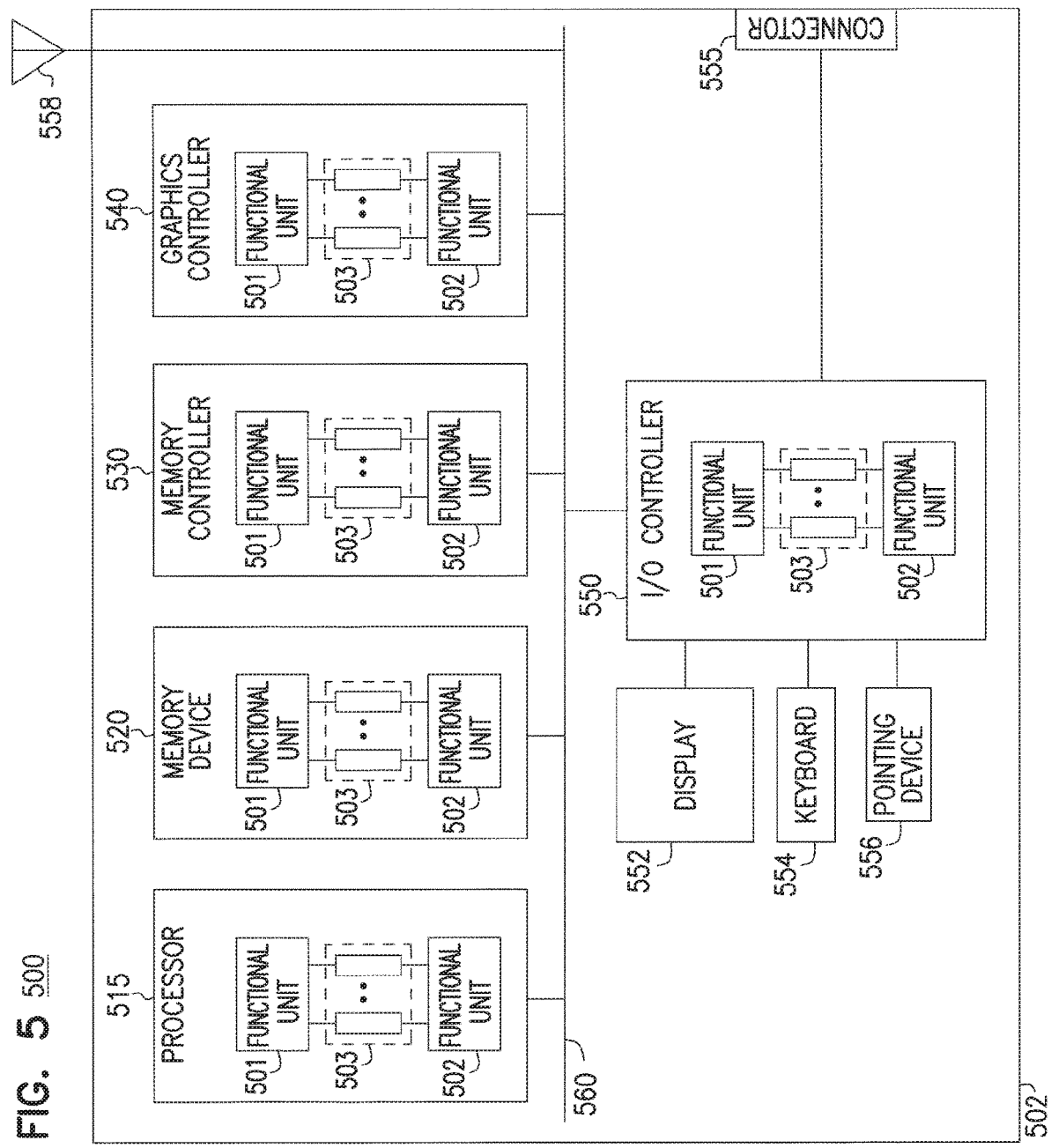

FUSED VOLTAGE LEVEL SHIFTING LATCH

CLAIM FOR PRIORITY

This application is a U.S. National Stage Filing under 35 U.S.C. 371 from International Application No. PCT/US2017/049373, filed on Aug. 30, 2017 which was published as WO 2018/063712, on Apr. 5, 2018, which claims the benefit of priority of U.S. application Ser. No. 15/277,189, filed Sep. 27, 2016, each of which are incorporated herein by reference in their entirety.

TECHNICAL FIELD

Embodiments described herein pertain to integrated circuit (IC) devices and systems. Some embodiments relate to voltage level shifting and latch circuitry.

BACKGROUND

Many IC devices and systems include voltage level shifting circuits to shift (e.g., translate) an input signal having one voltage level to an output signal having another voltage level. Such voltage level shifting may allow different devices that operate at different operating voltages to properly communicate (e.g., exchange information in the form of signals) with each other. Such IC devices and systems may also have latch circuits in addition to the voltage level shifting circuits. The latch circuits are used to latch (e.g., temporarily store) the value of information when the information is provided from one device to another device. Limitations in some conventional voltage level shifting circuits and latch circuits include a relatively higher time delay, small voltage shifting range, and large size. These limitations may render such voltage level shifting circuits and latch circuits unsuitable for some devices and systems.

BRIEF DESCRIPTION OF THE DRAWINGS

FIG. 5 shows an apparatus in the form of a system, according to some embodiments described herein.

DETAILED DESCRIPTION

Some techniques described herein include a voltage level shifting circuit and a latch circuit combined (e.g., fused) together.

As demand for multiple voltage domains in electronic devices (e.g., mobile devices and wearable products) increases, fast and robust voltage level shifting circuits for critical paths between different functional units (e.g., processing core and memory) are needed in an IC or in a system-on-chip (SoC) in such devices. These voltage level shifting circuits allow correct switching logic levels and static power free communication and contain contention circuitry that need to be properly designed, especially for low voltage operation (e.g., operations about 0.6V voltage range). Further, low voltage optimizations of these level shifting circuits are equally important because, if improperly sized and designed, these level shifting circuits could become performance limiters that may cause functionality failures (e.g., failures at minimum operating voltage (e.g., Vmin). Many of these level shifting circuits are usually located in critical timing paths of the IC or SoC. Thus, such level shifting circuits should be extremely fast and operating across a wide voltage range. These critical timing paths also have latches in the paths. Such latches may further increase time delay caused by the level shifting circuits on these paths.

As described in more detail below, the fused voltage level shifting circuit includes improvements over some conventional techniques that use separate voltage level shifting circuits and latch circuits. Such improvements include a relatively lower input-to-output time delay, wider voltage shifting range, and smaller size. Other improvements are also described below.

Figure 1:
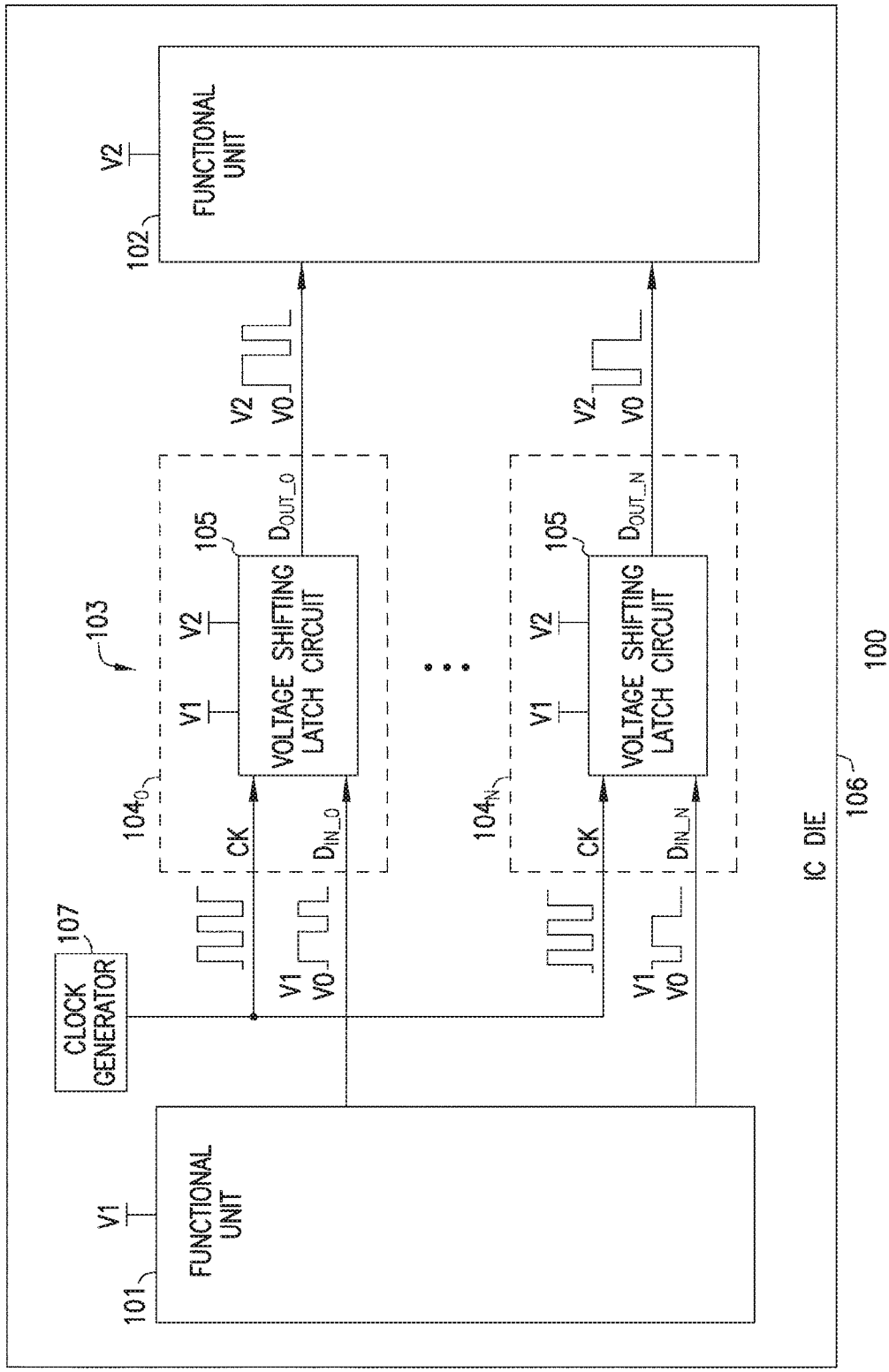
FIG. 1 shows an apparatus including functional units and voltage shifting latch circuits coupled between the functional units, according to some embodiments described herein.

FIG. 1 shows an apparatus 100 including functional units 101 and 102 and a connection 103 including circuits (voltage level shifting latch circuits 105), according to some embodiments described herein. Apparatus 100 can include or be included in an electronic device or system, such as a processor (e.g., a microprocessor, a digital signal processor (DSP), or other types of processors), an SoC, or other electronic devices or systems. The processor can include a central processing unit (CPU), a graphics processing unit (GPU), or other types of processing units. The processor can include a single-core microprocessor (e.g., a microprocessor that includes a single CPU (single CPU core)) or a multi-core microprocessor (e.g., a microprocessor that includes multiple CPUs (multiple CPU cores)).

As shown in FIG. 1, apparatus 100 can include a semiconductor substrate (e.g., semiconductor die, such as a silicon die) 106. Functional units 101 and 102 and connection 103 (which includes circuits 105) can be located (e.g., formed in or formed on) semiconductor substrate. Functional units 101 and 102 may operate with different voltage domains such as different voltages V1 and V2 (e.g., different supply voltages), respectively.

Functional unit 101 can include a processing core (e.g., CPU that includes an arithmetic logic unit (ALU)). Functional unit 102 can include a memory device (e.g., cache memory on the same die as the processing core). Connection 103 can be a bus connection (e.g., on-die bus) to carry information (e.g., data) between functional units 101 and 102. Functional unit 101 can operate to send information to functional unit 102 in the form of signals (e.g., input signals) $D_{IN\_0}$ and $D_{IN\_N}$ through connection 103. Each of signals $D_{IN\_0}$ and $D_{IN\_N}$ can carry bits of information (e.g., bits of data). Apparatus 100 can include a clock generator 107 to provide a signal (e.g., clock signal) CK that can be used as timing signal for signals $D_{IN\_0}$ and $D_{IN\_N}$. Functional unit 101 may use a source-synchronous technique to communicate with (e.g., to send signals $D_{IN\_0}$ and $D_{IN\_N}$) functional unit 102 through connection 103. Connection 103 can operate to provide signals (e.g., output signals) $D_{OUT\_0}$ and $D_{OUT\_N}$ to functional unit 102 based on signals $D_{IN\_0}$ and $D_{IN\_N}$, respectively. Functional unit 102 may also use a clock signal (e.g., a clock signal (not shown) generated by clock generator 107) in order to receive (e.g., capture) signals $D_{OUT\_0}$ and $D_{OUT\_N}$.

As shown in FIG. 1, connection 103 can include paths (e.g., bus paths or bus lanes) $104_0$ and $104_N$. Two paths $104_0$ and $104_N$ are shown as an example. However, the number of paths of connection 103 can vary. For example, connection 103 can include 128 paths (e.g., to carry 128 bits of data in parallel). Each of paths $104_0$ and $104_N$ includes a respective circuit 105 and may include other circuit elements (e.g., buffers and drivers, not shown in FIG. 1) coupled to circuit 105.

Each of circuits 105 of a respective path (among paths $104_0$ and $104_N$) can operate to perform voltage level shifting function and latch (e.g., data storage) function. Each of circuits 105 may operate with voltages (e.g., supply voltages) V1 and V2. Circuits 105 perform the voltage level shifting function in order to allow information to be properly communicated (e.g., correct switching between logic levels and static power free communication) between functional units 101 and 102.

For example, circuit 105 of path $104_0$ can operate to shift (e.g., to translate) the voltage level (e.g., V1) of signal $D_{IN\_0}$ after it is received from functional unit 101. The shifted voltage level can be the voltage level (e.g., V2) that matches the supply voltage (e.g., V2) of functional unit 102. Circuit 105 of path $104_0$ can also operate to latch information (e.g., store states of bits of the information) carried by signal $D_{IN\_0}$. The latched information can include a level corresponding to the shifted voltage level (translated from the level of signal $D_{IN\_0}$). Circuit 105 of path $104_0$ can operate to provide the latched information in the form of signal $D_{OUT\_0}$ to functional unit 102 based on timing (e.g., the frequency) of signal CK. Signal $D_{OUT\_0}$ can include a level corresponding to the shifted voltage level (translated from the level of signal $D_{IN\_0}$).

Similarly, circuit 105 of path $104_N$ can operate to shift (e.g., to translate) the voltage level (e.g., V1) of signal $D_{IN\_N}$ after it is received from functional unit 101. Circuit 105 of path $104_N$ can also operate to latch information carried by signal $D_{IN\_N}$. The latched information can include a level corresponding to the shifted voltage level (translated from the level of signal $D_{IN\_N}$). Circuit 105 of path $104_N$ can operate to provide the latched information in the form of signal $D_{OUT\_N}$ to functional unit 102 based on timing (e.g., the frequency) of signal CK. Signal $D_{OUT\_N}$ can include a level corresponding to the shifted voltage level (translated from the level of signal $D_{IN\_N}$).

Thus, as described above, in each of paths $104_0$ and $104_N$ of connection 103, circuit 105 can operate to perform dual-function: shifting the voltage level of a respective input signal (among signals $D_{IN\_0}$ and $D_{IN\_N}$) and latching information (e.g., states) carried by the respective input signal based on timing of signal CK. By performing these functions, circuit 105 can be called a voltage level shifting latch circuit.

As shown in FIG. 1, each of signals $D_{IN\_0}$ and $D_{IN\_N}$ can change between levels (signal levels) that correspond voltages V0 and V1. Each of signals $D_{OUT\_0}$ and $D_{OUT\_N}$ can change between levels (signal levels) that correspond voltages V0 and V2. The value of voltage V2 can be greater than the value of voltage V1. Thus, the voltage range (e.g., signal swing) of each of signals $D_{OUT\_0}$ and $D_{OUT\_N}$ can be greater than the voltage range (e.g., signal swing) of each of signals $D_{IN\_0}$ and $D_{IN\_N}$.

FIG. 1 shows an example where circuits 105 are outside (e.g., not part of) functional units 101 and 102. Alternatively, portions of each of circuits 105 (or all of circuits 105) can be included in (e.g., can be a part of) functional unit 101 or functional unit 102.

Circuits 105 of FIG. 1 can include circuit elements and operate in fashions similar to or the same as any of voltage level shifting latch circuits described below with reference to FIG. 2 through FIG. 5.

Figure 2:
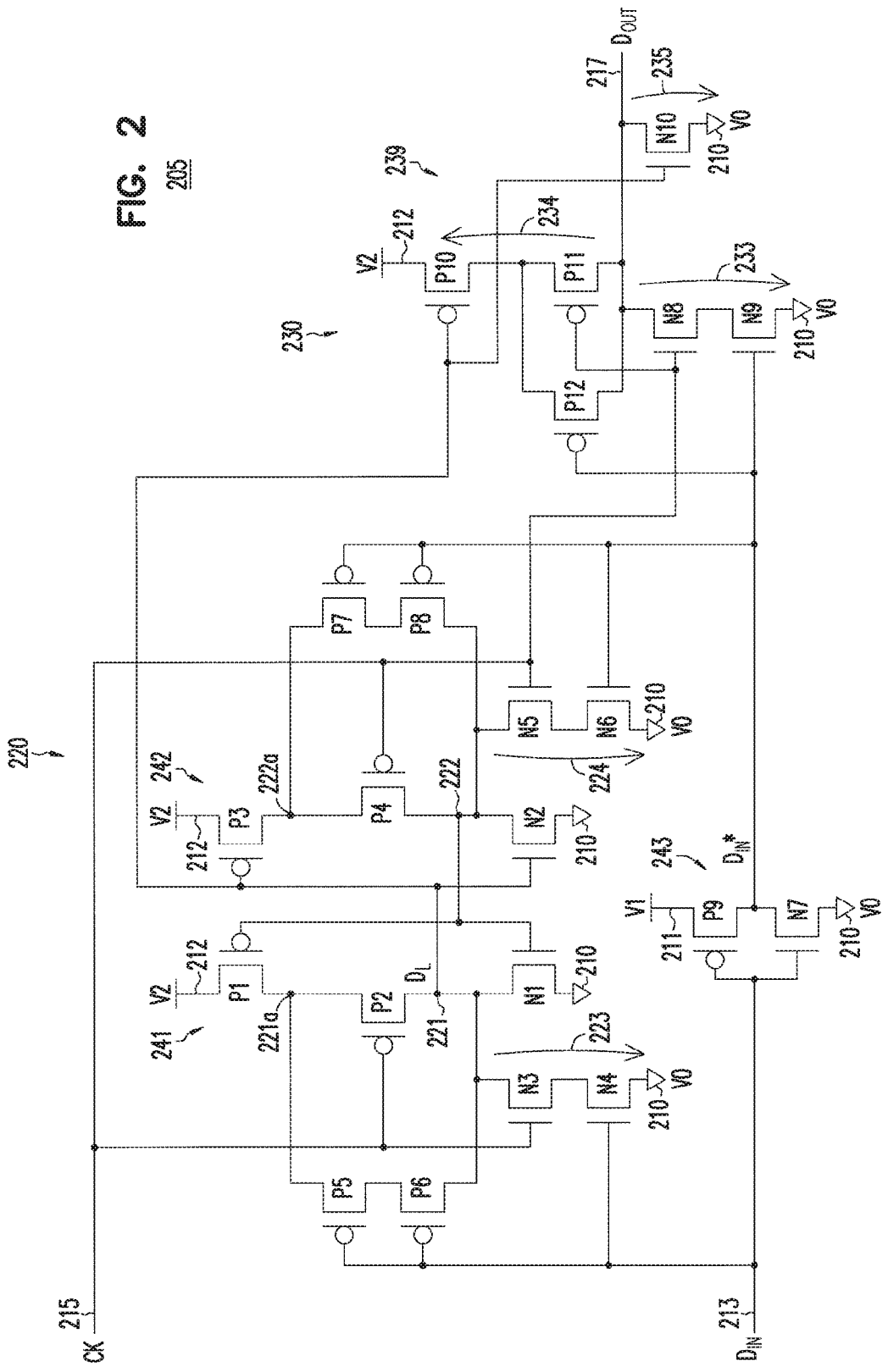
FIG. 2 shows a voltage shifting latch circuit, according to some embodiments described herein.

FIG. 2 shows a circuit 205, according to some embodiments described herein. Circuit 205 can be used as circuit 105 of each of paths $104_0$ and $104_N$ of connection 103 in FIG. 1. Circuit 205 of FIG. 2 can operate to perform voltage level shifting function and a latch function similar to circuit 105 of each of paths $104_0$ and $104_N$ of connection 103 in FIG. 1. Thus, circuit 205 of FIG. 2 can be called a voltage level shifting latch circuit.

As shown in FIG. 2, circuit 205 can include an input stage 220 and an output stage 230. Circuit 205 can include nodes (e.g., supply nodes) 211 and 212 to receive voltages V1 and V2, respectively, and a node (e.g., ground node) 210 to receive a voltage V0. Node 210 can be coupled to a ground connection. Thus, voltage V0 can have a value of 0V. Voltages V1 and V2 can have different values (positive values) greater than the value of voltage V0. The value of voltage V2 can be greater than the value of voltage V1. As an example, voltage V1 can have a value of less than 1V (e.g., a value in a range from 0.6V to 7.5V, or another range), and voltage V2 can have a value of 1V or higher (e.g., a value in a range from 1V to 1.8V, or another range).

Circuit 205 can include a node (e.g., input node) 213 to receive a signal (e.g., input signal) $D_{IN}$, a node (e.g., clock node) 215 receive a signal (e.g., clock signal) CK, and a node (e.g., output node) 217 to provide a signal (e.g., output signal) $D_{OUT}$. Circuit 205 can include a node (e.g., internal node or storage latch node) 221 to provide a signal (e.g., internal signal) $D_L$. Signal $D_{IN}$ can correspond to one of signals $D_{IN\_0}$ and $D_{IN\_N}$ of FIG. 1. Signal $D_{OUT}$ of FIG. 2 can correspond to one of signals $D_{OUT\_0}$ and $D_{OUT\_N}$ of FIG. 1. In FIG. 2, signal CK can be used as a timing signal to receive signal $D_{IN}$ and to provide signal $D_{OUT}$.

Signal $D_{IN}$ in FIG. 2 can be provided by a functional unit, such as functional unit 101 of FIG. 1. Signal $D_{OUT}$ in FIG. 2 can be provided to another functional unit, such as functional unit 102 of FIG. 1. In FIG. 2, voltage V1 can be the same as the supply voltage of a functional unit (e.g., 101 in FIG. 1) that provides signal $D_{IN}$ to circuit 205, and voltage V2 can be the same as the supply voltage of a functional unit (e.g., 102 in FIG. 1) that receives signal $D_{OUT}$ from circuit 205.

In operation, input stage 220 can receive signal $D_{IN}$ (at node 213) based on timing (e.g., the frequency) of signal CK (at node 215). Input stage 220 can perform a voltage level shifting function to shift (e.g., translate) the voltage level (e.g., V1) of signal $D_{IN}$ after it is received at node 213. The shifted voltage level can be the voltage level corresponding to the value of voltage V2. Input stage 220 can also perform a latch function to latch information (e.g., store states associated with bits of the information) carried by signal $D_{IN}$. The latched information can be represented by signal $D_L$ at node 221. Signal $D_L$ (which presents latched information) can include a level corresponding to the shifted voltage level (e.g., the value of voltage V2) translated from the level of signal $D_{IN}$. The latched information presented by signal $D_L$ is protected input/output information, such that the levels of signal $D_L$ are not influenced by the signal at node 217.

Output stage 230 can operate to receive signal CK from node 215, signal $D_L$ from node 221, and a signal $D_{IN}$* (which is an inverted version of signal $D_{IN}$). Output stage 230 can operate to provide the latched information (represented by signal $D_L$) in the form of signal $D_{OUT\_0}$ to node 217 based on a timing of signal CK. Signal $\overline{D}_{OUT}$ can include a level corresponding to the shifted voltage level (e.g., the value of voltage V2 translated from the level of signal $D_{IN}$). Detailed description of circuit 205 is described below after the description of FIG. 3.

Figure 3:
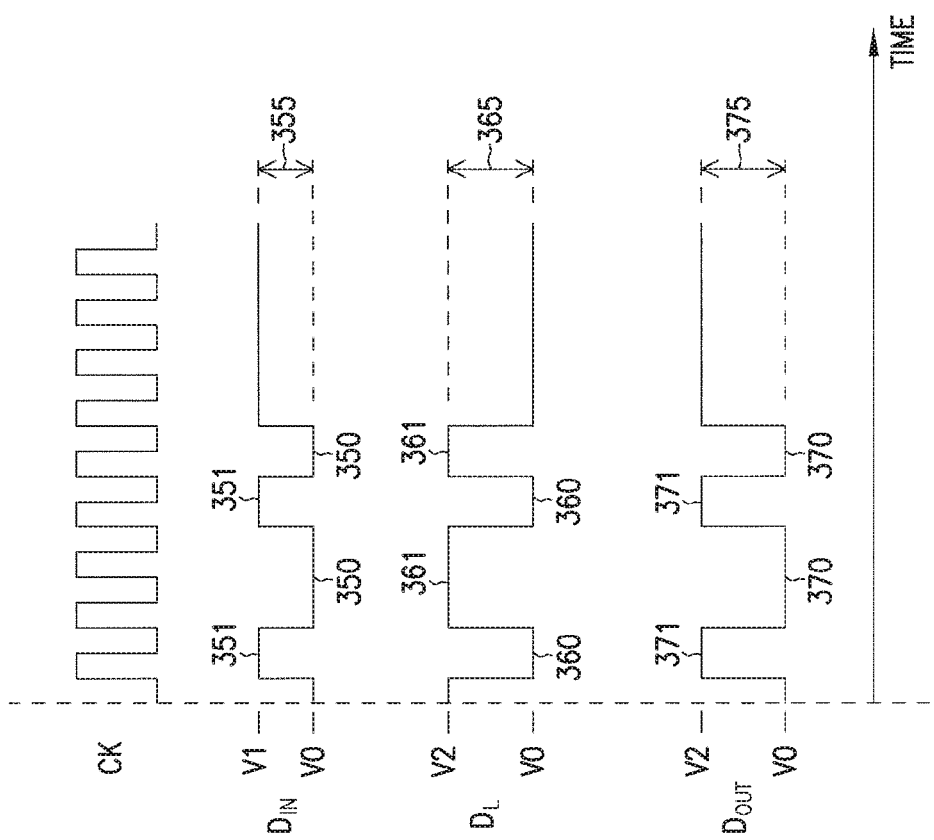
FIG. 3 shows an example timing diagram for some signals of the voltage shifting latch circuit of FIG. 2, according to some embodiments described herein.

FIG. 3 shows an example timing diagram for some signals of circuit 205 of FIG. 2, according to some embodiments described herein. As shown in FIG. 3, signal CK is a periodical signal that changes between different levels (e.g., levels corresponding to voltages V0 and V2). Signal $D_{IN}$ can change (e.g., swing) within a voltage range (e.g., signal swing) 355 that includes levels 350 and 351. Levels 350 and 351 can correspond to voltage V0 (e.g., 0V) and voltage V1, respectively. Thus, voltage range 355 can have voltage values ranging from the value of voltage V0 to the value of voltage V1. The value of voltages V0 and V1 can be used to represent the values of information (e.g., bits) carried by signal $D_{IN}$. For example, the value of voltages V0 and V1 can be used to represent logic 0 (binary 0) and logic 1 (binary 1), respectively, of bits of information carried by signal $D_{IN}$.

Signal $D_{IN}$ can change from level 350 to level 351 or from level 351 to level 350 depending on the value of information (e.g., bits of data) carried by signal $D_{IN}$. For example, during a particular time interval (e.g., during a particular period of signal CK), signal $D_{IN}$ can have level 350 if a bit of information carried by signal $D_{IN}$ at that particular time interval has one value (e.g., logic 0), or level 351 if a bit of information carried by signal $D_{IN}$ at that particular time interval has another value (e.g., logic 1). Signal $D_{IN}$ can change from one level to another level (e.g., from level 350 to level 351 or vice versa) if the value of information carried by signal $D_{IN}$ changes from one value to another value (e.g., from logic 0 to logic 1, or vice versa).

As shown in FIG. 3, signal $D_L$ can change (e.g., swing) within a voltage range (e.g., signal swing) 365 that includes levels 360 and 361. Levels 360 and 361 can correspond to voltage V0 and voltage V2, respectively. Thus, voltage range 365 can have voltage values ranging from the value of voltage V0 to the value of voltage V2. As described above, the value of voltage V2 can be greater than the value of voltage V1. Thus, voltage range 365 (e.g., from V0 to V2) of signal $D_L$ can be greater than voltage range 355 (e.g., from V0 to V1) of signal $D_{IN}$. Signal $D_{IN}$ can change from one level to another level (e.g., from level 360 to level 361, or vice versa) if signal $D_{IN}$ changes from one value to another value (e.g., from level 351 to level 350, or vice versa). As shown in FIG. 3, signal $D_L$ can change in a direction opposite from that of signal $D_{IN}$. For example, during a particular time interval, signal $D_L$ can have level 360 if signal $D_{IN}$ has level 350. Then, signal $D_L$ can change from level 360 to level 361 if signal $D_{IN}$ changes from level 351 to level 350.

Signal $D_{OUT}$ can change (e.g., swing) within a voltage range (e.g., signal swing) 375 that includes levels 370 and 371. Levels 370 and 371 can correspond to voltage V0 and voltage V2, respectively. Thus, voltage range 375 can have voltage values ranging from the value of voltage V0 to the value of voltage V2. Therefore, voltage range 375 (e.g., from V0 to V2) can be the same as voltage range 365 (e.g., from V0 to V2) of signal $D_{OUT}$ and greater voltage range 355 of signal $D_{IN}$. Signal $D_{OUT}$ can change between levels 370 and 371 based on the levels of signal $D_L$ and $D_{IN}$* (which is based on signal $D_{IN}$). As shown in FIG. 3, signal $D_L$ can change in a direction that is opposite from that of signal $D_L$ and in another direction that is the same as that of signal $D_{IN}$. For example, during a particular time interval, signal $D_{OUT}$ (e.g., output signal) can have level 371 if signal $D_{IN}$ has level 351. Then, signal $D_{OUT}$ can change from level 371 to level 370 if signal $D_{IN}$ changes from level 351 to level 350. Since signal $D_{OUT}$ changes levels in the same direction as that of signal DI, circuit 205 (FIG. 2) includes a non-inverting output (e.g., output at node 217).

As described above, levels 370 and 371 can correspond to voltages V0 and V2. Thus, the value of voltages V0 and V2 can be used to represent the values of information (e.g., bits) carried by signal $D_{OUT}$. For example, the value of voltages V0 and V2 can be used to represent logic 0 and logic 1, respectively, of bits of information carried by signal $D_{OUT}$. Although the values of voltages V1 and V2 can be used to represent the same value (e.g., logic 1) of a bit of information carried by signals $D_{IN}$ and $D_{OUT}$, using voltage V2 (instead of V1) for signal $D_{OUT}$ may allow the functional unit (e.g., functional unit 102 of FIG. 1) that operates at a supply voltage V2 to properly receive information carried by signal $D_{OUT}$.

Referring to FIG. 2, circuit 205 can include transistors P1 through P12 and N1 through N10. Each of transistors P1 through P12 can include a field effect transistor (FET), such as a p-channel metal-oxide semiconductor (PMOS) transistor. Each of transistors N1 through N10 can include an n-channel metal-oxide semiconductor (NMOS) transistor. Input stage 220 can include transistors P1 through P9 and N1 through N7. Output stage 230 can include transistors P10 through P12 and N8 through N10.

Transistors P1, P2, and N1 can be part of an inverter 241. Transistors P3, P4, and N2 can be part of an inverter 242. Inverters 241 and 242 can be cross-coupled to each other as shown in FIG. 2 to form a latch that is clocked by signal CK. Inverters 241 and 242 allow input stage 220 to latch information (carried by signal $D_{IN}$) at node 221, which is an output node of inverter 241 and an input node of inverter 242. The level of signal $D_L$ at node 221 can represent the value (e.g., logic 0 or logic 1) of latched information. Inverters 241 and 242 can also operate to cause the voltage range (e.g., from V0 to V2) of the levels of signal $D_L$ to be greater than the voltage range (e.g., from V0 to V1) of the levels of signal $D_{IN}$.

As shown in FIG. 2, transistors P9 and N7 can form an inverter 243 to provide signal $D_{IN}$* (at the output node of inverter 243) based on signal $D_{IN}$ at node 213, which can be coupled to the input node of inverter 243. As described above, signal $D_{IN}$ can have a voltage range (e.g., signal swing) having voltage values ranging from the value of voltage V0 and voltage V1. Inverter 243 can operate at voltage V1 to help prevent short circuit current that may occur in circuit 205.

As shown in FIG. 2, input stage 220 can include a circuit path 223 between nodes 221 and node 210, and a circuit path 224 between nodes 222 and 210. Node 222 is an input node of inverter 241 and an output node of inverter 242. Circuit path 223 includes transistors N3 and N4 having gates to receive signals CK and $D_{IN}$, respectively. Circuit path 224 includes transistors N5 and N6 having gates to receive signals CK and $D_{IN}$*, respectively. Circuit paths 223 and 224 allow input stage 220 to receive (e.g., clock) signal $D_{IN}$ based on timing of signal CK.

The inclusion of transistors P5 and P6 in circuit 205 may allow the width of transistor N1 (e.g., clocked pull-down transistor) to be relatively smaller and allow a balance in a pull-up/pull-down ratio of the transistors (PMOS and NMOS transistor ratio) of inverter 241. Similarly, the inclusion of transistors P7 and P8 in circuit 205 may allow the width of transistor N2 (e.g., clocked pull-down transistor) to be relatively smaller and allow a balance in a pull-up/pull-down ratio of the transistor (PMOS and NMOS transistor ratio) of inverter 242. Transistors P5, P6, P7, and P8 may also allow proper operation and improve the level shifting (e.g., based on minimum voltage Vmin at node 213) function of circuit 205. For example, transistors P5, P6, P7, and P8 may help reduce contention that may occur at node 221 or node 222 when signal $D_{IN}$ changes between levels. For a balanced operation of circuit 205, the number of transistors between nodes 221 and 221a and the number of transistors between nodes 222 and 222a can be the same.

FIG. 2 shows circuit 205 including two transistors P5 and P6 coupled to nodes 221 and 221a and two transistors P6 and P7 coupled to nodes 222 and 222 as an example. The number of transistors (similar to transistors P5 and P6) coupled to nodes 221 and 221a and the number of transistors (similar to transistors P7 and P8) coupled to nodes 222 and 222a can vary. The number of transistors (similar to transistors P5 and P6) coupled in parallel with transistor P2 between nodes 221 and 221a and the number of transistors (similar to transistors P7 and P8) coupled in parallel with transistor P4 between nodes 222 and 222a can be based on the difference between the values of signals V1 and V2. For example, circuit 205 can include fewer transistors (similar to transistors P5 and P6) coupled in parallel with transistor P2 and fewer transistors (similar to transistors P7 and P8) coupled in parallel with transistor P4 if the difference between the values of voltages V1 and V2 is relatively small. In the opposite, circuit 205 can include more transistors (similar to transistors P5 and P6) coupled in parallel with transistor P2 and more transistors (similar to transistors P7 and P8) coupled in parallel with transistor P4 if the difference between the values of voltages V1 and V2 is relatively large. Thus, in an example alternative arrangement of circuit 205, one of transistors P5 and P6 and one of transistors P7 and P8 can be omitted. In another example alternative arrangement of circuit 205, one or more additional transistors can be coupled in series (e.g., in a stack) with transistors P5 and P6 between nodes 221 and 221a, and one or more additional transistors can be coupled in series (e.g., in a stack) with transistors P7 and P8 between nodes 222 and 222a.

As shown in FIG. 2, output stage 230 can include a circuit path 233 between nodes 210 and node 217, a circuit path 234 between nodes 212 and 217, and a circuit path 235 (different from circuit path 233) between nodes 210 and 217. Circuit path 233 includes transistors N8 and N9 having gates to receive signals CK and $D_{IN}$*, respectively. Circuit path 233 allows output stage 230 to provide signal $D_{OUT}$ at node 217 based on timing of signal CK. Circuit path 234 includes transistors P10 and P11, and circuit path 235 includes transistor N10. Transistors P10 and P11 of circuit path 234 and transistor N10 of circuit path 235 can be part of an inverter (e.g., output inverter) 239. Inverter 239 can operate to provide signal $D_{OUT}$ at node 217 and to allow the levels of signal $D_{OUT}$ to have a voltage range with values corresponding to the values of voltages V0 and V2.

Circuit 205 can include improvements over some conventional voltage shifting and latch techniques. For example, some conventional techniques may use a voltage level shifting circuit to perform a voltage level shifting function and then use a separate latch circuit (in addition to the voltage level shifting circuit) to perform a latch function. Such separate shifting and latching functions in the conventional techniques may have a relatively higher time delay (e.g., input to output delay). The size of the circuits in the conventional techniques may also be relatively large.

In circuit 205, as described above, voltage level shifting function and latch function are combined (or fused) into one circuit. This may allow circuit 205 to have a relatively lower input-to-output time delay and a wider voltage shifting range than the separate circuits in some conventional techniques. Further, the combined voltage level shifting and latch function may allow circuit 205 to have a smaller size than the separate circuits in some conventional techniques. Moreover, the protected input/output and non-inverting properties of circuit 205 may allow it to be compatible some existing design synthesis flows.

Figure 4:
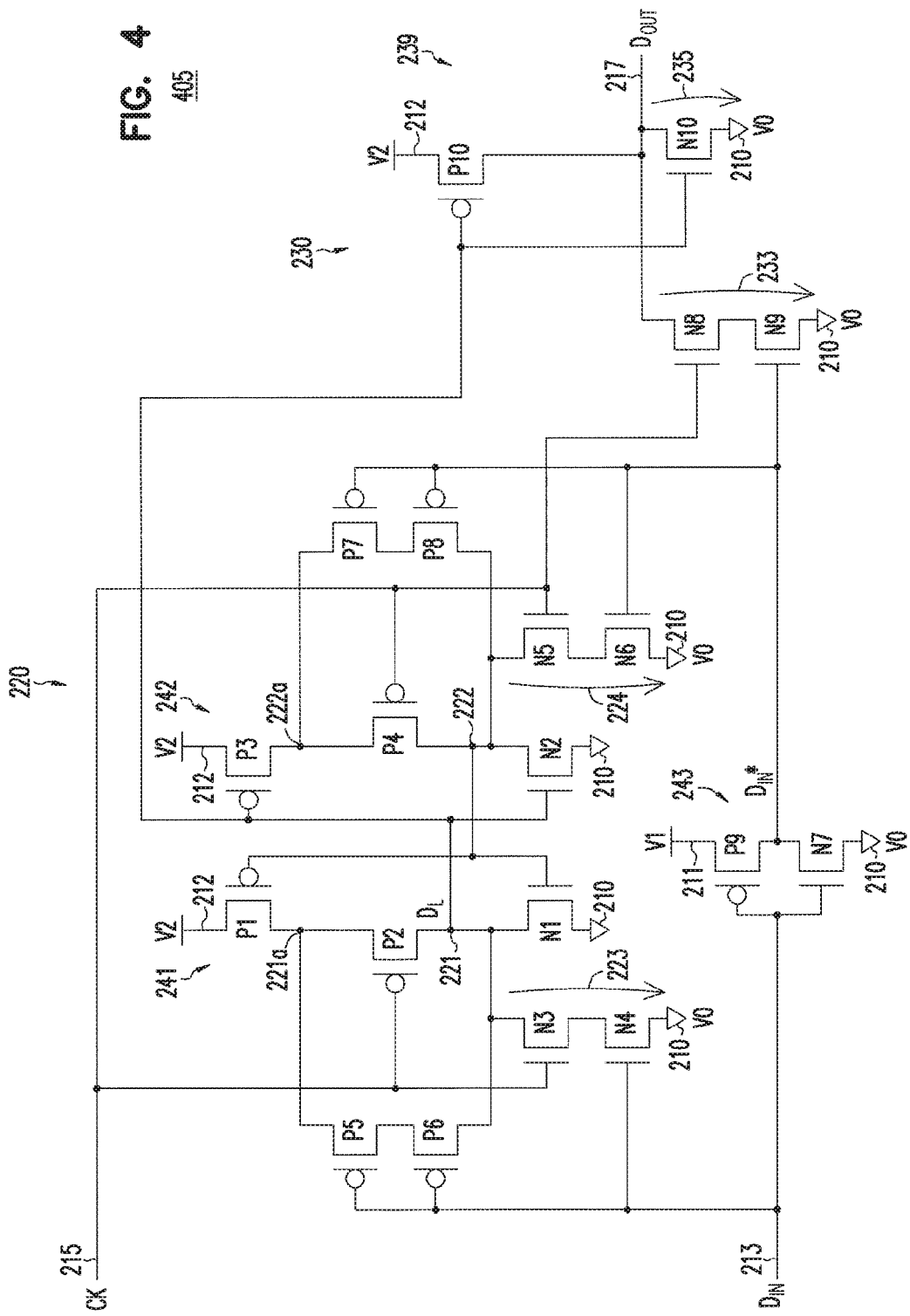
FIG. 4 shows a voltage shifting latch circuit, which can be a variation of the voltage shifting latch circuit of FIG. 2, according to some embodiments described herein.

FIG. 4 shows a circuit 405, which can be a variation of circuit 205 of FIG. 2, according to some embodiments described herein. Circuit 405 includes similar elements as circuit 205. The function of circuit 405 can also be similar to the function of circuit 205. For simplicity, similar or identical elements between circuits 205 and 405 are given the same designation labels, and the description of similar or identical elements between circuits 205 and 405 is omitted from the description of FIG. 4. Differences between circuits 205 and 405 include the omission of transistors P11 and P12 in circuit 405. Without transistors P11 and P12 in FIG. 4, circuit 405 may have a higher drive strength than circuit 205. In comparison with some conventional voltage shifting and latch techniques, circuit 405 can have improvements similar to those described above for circuit 205.

FIG. 5 shows an apparatus in the form of a system (e.g., electronic system) 500, according to some embodiments described herein. System 500 can include or be included in a mobile device, a wearable product, a computer, a tablet, or other electronic device or system. As shown in FIG. 5, system 500 can include components located on a circuit board (e.g., printed circuit board (PCB)) 502, such as a processor 515, a memory device 520, a memory controller 530, a graphics controller 540, an I/O (input/output) controller 550, a display 552, a keyboard 554, a pointing device 556, at least one antenna 558, a connector 555, and a bus (e.g., on-board bus) 560. Bus 560 can include conductive lines (e.g., metal-based traces) on circuit board 502.

In some arrangements, system 500 does not have to include a display. Thus, display 552 can be omitted from system 500. In some arrangements, system 500 does not have to include any antenna. Thus, antenna 558 can be omitted from system 500. In some arrangements, system 500 does not have to include a connector. Thus, connector 555 can be omitted from system 500.

Processor 515 can include a general-purpose processor or an application specific integrated circuit (ASIC). Processor 515 can include a CPU.

Memory device 520 can include a dynamic random access memory (DRAM) device, a static random access memory (SRAM) device, a flash memory device, phase change memory, a combination of these memory devices, or other types of memory. FIG. 5 shows an example where memory device 520 is a stand-alone memory device separated from processor 515. In an alternative arrangement, memory device 520 and processor 515 can be located on the same die. In such an alternative arrangement, memory device 520 is an embedded memory in processor 515, such as embedded DRAM (eDRAM), embedded SRAM (eSRAM), embedded flash memory, or another type of embedded memory.

Display 552 can include a liquid crystal display (LCD), a touchscreen (e.g., capacitive or resistive touchscreen), or another type of display. Pointing device 556 can include a mouse, a stylus, or another type of pointing device.

I/O controller 550 can include a communication module for wired or wireless communication (e.g., communication through one or more antenna 558). Such wireless communication may include communication in accordance with WiFi communication technique, Long Term Evolution Advanced (LTE-A) communication technique, or other communication techniques.

I/O controller 550 can also include a module to allow system 500 to communicate with other devices or systems in accordance with one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 555 can be arranged (e.g., can include terminals, such as pins) to allow system 500 to be coupled to an external device (or system). This may allow system 500 to communicate (e.g., exchange information) with such a device (or system) through connector 555. Connector 555 and at least a portion of bus 560 can include conductive lines that conform with at least one of USB, DP, HDMI, Thunderbolt, PCIe, Ethernet, and other specifications.

As shown in FIG. 5, each of processor 515, memory device 520, memory controller 530, graphics controller 540, and I/O controller 550 can include functional units 501 and 502, and a connection (e.g., on-die bus) 503. Connection 503 can include any of the voltage shifting latch circuits (e.g., 105, 205, and 405) described above with reference to FIG. 1 through FIG. 4. FIG. 5 shows each of processor 515, memory device 520, memory controller 530, graphics controller 540, and I/O controller 550 including functional units 501 and 502, and connection 503, as an example. However, fewer than all of processor 515, memory device 520, memory controller 530, graphics controller 540, and I/O controller 550 can include all of functional units 501 and 502, and connection 503.

FIG. 5 shows the components of system 500 arranged separately from each other as an example. For example, each of processor 515, memory device 520, memory controller 530, graphics controller 540, and I/O controller 550 can be located on a separate IC (e.g., semiconductor die or an IC chip). In some arrangements, two or more components (e.g., processor 515, memory device 520, graphics controller 540, and I/O controller 550) of system 500 can be located on the same die (e.g., same IC chip) that forms a system-on-chip.

The illustrations of the apparatuses (e.g., apparatus 100 and system 500 including circuits 105, 205, and 405) and methods (e.g., operations of apparatus 100 and system 500 including operations of circuits 105, 205, and 405) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, wearable products, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including an input stage to receive an input signal and a clock signal and to provide an internal signal at an internal node based at least in part on the input signal, the input signal having levels in a first voltage range, the internal signal having levels in a second voltage range greater than the first voltage range, and an output stage to receive the internal signal, the clock signal, and an additional signal generated based on the input signal, the output stage to provide an output signal based at least in part on the input signal and the additional signal, the output signal having a third voltage range greater than the first voltage range.

In Example 2, the subject matter of Example 1 may optionally include, wherein the input stage includes a first inverter including a first output node coupled to the internal node, a second inverter including an input node coupled to the internal node, and a second output node coupled to an input node of the first inverter.

In Example 3, the subject matter of Example 2 may optionally include, wherein the input stage includes a third inverter including an input node to receive the input signal and an output node to provide the additional signal, the third inverter including a transistor coupled to a first supply node, and each of the first and second inverters including a transistor coupled to a second supply node, the first supply node to receive a first voltage having a first value, the second supply node to receive a second voltage having a second value greater than the first value.

In Example 4, the subject matter of Example 2 may optionally include, wherein the input stage includes a first transistor coupled to the first output node of the first inverter and to an additional node of the first inverter, and a second transistor coupled to the second output node of the second inverter and to an additional node of the second inverter.

In Example 5, the subject matter of Example 2 may optionally include, wherein the input stage includes a first transistor coupled between a supply node and a ground node, the first transistor including a gate to receive the clock signal, and a second transistor coupled between the supply node and the ground node, the second transistor including a gate to receive the clock signal.

In Example 6, the subject matter of Example 1 may optionally include, wherein the input stage includes a circuit path between the internal node and a ground node, the circuit path including a first transistor including a gate to receive the clock signal, and a second transistor including a gate to receive the input signal.

In Example 7, the subject matter of Example 6 may optionally include, wherein the input stage includes an additional node, and an additional circuit path between the additional node and the ground node, the additional circuit path including a third transistor including a gate to receive the clock signal, and a fourth transistor including a gate to receive the additional signal.

In Example 8, the subject matter of Example 1 may optionally include, wherein the input stage includes an inverter including an input node to receive the input signal and an output node to provide the additional signal.

In Example 9, the subject matter of any of Examples 1-8 may optionally include, wherein the output stage includes an output node to provide the output signal, and a circuit path between the output node and a ground node, the circuit path including a first transistor including a gate to receive the clock signal, and a second transistor including a gate to receive the additional signal.

In Example 10, the subject matter of Example 9 may optionally include, wherein the output stage includes a first additional circuit path between the output node and a supply node, and a second additional circuit path between the output node and the ground node.

In Example 11, the subject matter of any of Examples 1-8 may optionally include, wherein the output stage includes a first transistor and a second transistor coupled between the output node and a supply node, and a third transistor coupled between the output node and the ground node.

In Example 12, the subject matter of Example 11 may optionally include, wherein the output stage includes a fourth transistor coupled to the output node and to a node between first and second transistors.

In Example 13, the subject matter of any of Examples 1-8 may optionally include, wherein the output stage includes an output node to provide the output signal, a first transistor and a second transistor coupled between the output node and a ground node, the first transistor including a gate to receive the clock signal, and the second transistor including a gate to receive the additional signal, and an inverter including a first node coupled to the node of the input stage and a second node coupled to the output node.

Example 14 includes subject matter (such as a device, an electronic apparatus (e.g., circuit, electronic system, or both), or a machine) including a first functional unit located on a semiconductor substrate, the first functional unit including a first node to receive a first supply voltage, a second functional located on the semiconductor substrate, the second functional unit including a second node to receive a second supply voltage, the first and second supply voltage having different values, and a bus connection located on the semiconductor substrate and coupled between the first and second functional units, the bus connection including bus paths, at least one of the bus paths including a circuit, the circuit including an input stage to receive to receive an input signal from the first functional unit, to receive a clock signal, and to provide an internal signal to an internal node of the input stage based at least in part on the input signal, the input signal having a first voltage range, the internal signal having a second voltage range greater than the first voltage range, and an output stage to receive the internal signal, the clock signal, and an additional signal generated based on the input signal, the output signal to provide an output signal to the second functional unit based at least in part on the input signal and the additional signal, the output signal having a third voltage range greater than the first voltage range.

In Example 15, the subject matter of Example 14 may optionally include, wherein the apparatus comprises a processor, the first functional unit includes a first processing core included in the processor, and the second functional unit includes memory cells included in the processor.

In Example 16, the subject matter of Example 15 may optionally include, wherein the processor includes a cache memory, and the memory cells are included in the cache memory.

In Example 17, the subject matter of any of Examples 14-16 may optionally include, wherein the second supply voltage has a value greater than a value of the first supply voltage.

Example 18 includes subject matter (such as a device, an electronic apparatus (e.g., circuit, electronic system, or both), or a machine) including a first integrated circuit (IC) chip on a circuit board, a second IC chip on the circuit board and coupled to the first IC chip, and an antenna coupled to at least one of the first and second IC chips, at least one of the first and second IC chips including a first functional unit, a second functional unit, and a circuit coupled between the first and second functional units, the circuit including an input stage to receive to receive an input signal from the first functional unit, to receive a clock signal, and to provide an internal signal at an internal node of the input stage based at least in part on the input signal, the input signal having a first voltage range, the internal signal having a second voltage range greater than the first voltage range, and an output stage to receive the internal signal, the clock signal, and an additional signal generated based on the input signal, the output signal to provide an output signal to the second functional unit based at least in part on the input signal and the additional signal, the output signal having a third voltage range greater than the first voltage range.

In Example 19, the subject matter of Example 18 may optionally include, wherein the first functional unit includes a processing core of a processor, and the second functional unit includes a cache memory of the processor.

In Example 20, the subject matter of Example 18 or 19 may optionally include, further comprising a connector, the connector conforming with one of Universal Serial Bus (USB), High-Definition Multimedia Interface (HDMI), Thunderbolt, Peripheral Component Interconnect Express (PCIe), and Ethernet specifications.

Example 21 includes subject matter (such as a method of operating a device, an electronic apparatus (e.g., circuit, electronic system, or both), or a machine) including receiving an input signal and a clock signal at an input stage, generating an internal signal at an internal node of the input stage based at least in part on the input signal, the input signal having levels in a first voltage range, the internal signal having levels in a second voltage range greater than the first voltage range, receiving, at an output stage, the internal signal, the clock signal, and an additional, the additional signal generated based on the input signal, and providing, from the output stage, an output signal based at least in part on the input signal and the additional signal, the output signal having a third voltage range greater than the first voltage range.

In Example 22, the subject matter of Example 21 may optionally include, further comprising providing the input signal from a first functional unit of an integrated circuit to the input stage, and receiving, at a second functional unit of the integrated circuit, the output signal from the output stage.

In Example 23, the subject matter of Example 22 may optionally include, further comprising operating the first functional unit using a first supply voltage, and operating the second functional unit using a second supply voltage, the first and second supply voltage having different values.

In Example 24, the subject matter of Example 21 may optionally include, further comprising providing the input signal from a processing core of a processor the input stage, and receiving, at a cache memory of the processor, the output signal from the output stage.

Example 25 includes subject matter (such as a device, an electronic apparatus (e.g., circuit, electronic system, or both), or machine) including means for performing any of the methods of claims 21-24.

The subject matter of Example 1 through Example 25 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   an input stage to receive an input signal and a clock signal and to provide an internal signal at an internal node based at least in part on the input signal, the input signal having levels in a first voltage range, the internal signal having levels in a second voltage range greater than the first voltage range; and
   an output stage to receive the internal signal, the clock signal, and an additional signal generated based on the input signal, the output stage to provide an output signal at an output node based at least in part on the input signal and the additional signal, the output signal having a third voltage range greater than the first voltage range, the third voltage range being the same as the second voltage range, and the output signal being an inversion of the internal signal, the output stage including:
   a first transistor coupled between a supply node and the output node;
   a second transistor coupled between the first transistor and the output node, the second transistor including a gate to receive the clock signal; and
   a third transistor coupled between the output node and a ground node, the third transistor including agate coupled to the gate of the second transistor to receive the clock signal.

2. The apparatus of claim 1, wherein the input stage includes a first inverter including a first output node coupled to the internal node, a second inverter including an input node coupled to the internal node, and a second output node coupled to an input node of the first inverter.

3. The apparatus of claim 2, wherein the input stage includes a third inverter including an input node to receive the input signal and an output node to provide the additional signal, the third inverter including a transistor coupled to a first supply node, and each of the first and second inverters including a transistor coupled to a second supply node, the first supply node to receive a first voltage having a first value, the second supply node to receive a second voltage having a second value greater than the first value.

4. The apparatus of claim 2, wherein the input stage includes:
   a first transistor coupled to the first output node of the first inverter and to an additional node of the first inverter; and
   a second transistor coupled to the second output node of the second inverter and to an additional node of the second inverter.

5. The apparatus of claim 2, wherein the input stage includes:
   a first transistor coupled between a supply node and a ground node, the first transistor including a gate to receive the clock signal; and
   a second transistor coupled between the supply node and the ground node, the second transistor including a gate to receive the clock signal.

6. The apparatus of claim 1, wherein the input stage includes a circuit path between the internal node and a ground node, the circuit path including a first transistor including a gate to receive the clock signal, and a second transistor including a gate to receive the input signal.

7. The apparatus of claim 6, wherein the input stage includes an additional node, and an additional circuit path between the additional node and the ground node, the additional circuit path including a third transistor including a gate to receive the clock signal, and a fourth transistor including a gate to receive the additional signal.

8. The apparatus of claim 1, wherein the input stage includes an inverter including an input node to receive the input signal and an output node to provide the additional signal.

9. The apparatus of claim 1, wherein the output stage includes a first additional transistor, the additional transistor including a gate to receive the additional signal.

10. The apparatus of claim 9, wherein the output stage includes a second additional transistor coupled between the output node and the ground node.

11. The apparatus of claim 1, wherein the output stage includes a fourth transistor coupled to the output node and to a node between first and second transistors.

12. The apparatus of claim 1, wherein the output stage includes a fourth transistor coupled between the third transistor and the ground node.

13. An apparatus comprising:
   a first functional unit located on a semiconductor substrate, the first functional unit including a first node to receive a first supply voltage;
   a second functional unit located on the semiconductor substrate, the second functional unit including a second node to receive a second supply voltage, the first and second supply voltage having different values; and
   a bus connection located on the semiconductor substrate and coupled between the first and second functional units, the bus connection including bus paths, at least one of the bus paths including a circuit, the circuit including:
   an input stage to receive to receive an input signal from the first functional unit, to receive a clock signal, and to provide an internal signal to an internal node of the input stage based at least in part on the input signal, the input signal having a first voltage range, the internal signal having a second voltage range greater than the first voltage range;
   an output stage to receive the internal signal, the clock signal, and an additional signal generated based on the input signal, the output signal to provide an output signal to the second functional unit based at least in part on the input signal and the additional signal, the output signal having a third voltage range greater than the first voltage range, the third voltage range being the same as the second voltage range, and the output signal being an inversion of the internal signal, the output stage including:
a first transistor coupled between a supply node and the output node:
a second transistor coupled between the first transistor and the output node, the second transistor including a gate to receive the clock signal; and
a third transistor coupled between the output node and a ground node, the third transistor including a gate coupled to the gate of the second transistor to receive the clock signal.

14. The apparatus of claim 13, wherein the apparatus comprises a processor, the first functional unit includes a first processing core included in the processor, and the second functional unit includes memory cells included in the processor.

15. The apparatus of claim 14, wherein the processor includes a cache memory, and the memory cells are included in the cache memory.

16. The apparatus of claim 13, wherein the second supply voltage has a value greater than a value of the first supply voltage.

17. An apparatus comprising:
a first integrated circuit (IC) chip on a circuit board;
a second IC chip on the circuit board and coupled to the first IC chip; and
an antenna coupled to at least one of the first and second IC chips, at least one of the first and second IC chips including:
a first functional unit;
a second functional unit; and
a circuit coupled between the first and second functional units, the circuit including:
an input stage to receive to receive an input signal from the first functional unit, to receive a clock signal, and to provide an internal signal at an internal node of the input stage based at least in part on the input signal, the input signal having a first voltage range, the internal signal having a second voltage range greater than the first voltage range; and
an output stage to receive the internal signal, the clock signal, and an additional signal generated based on the input signal, the output signal to provide an output signal to the second functional unit based at least in part on the input signal and the additional signal, the output signal having a third voltage range greater than the first voltage range, the third voltage range being the same as the second voltage range, and the output signal being an inversion of the internal signal, the output stage including:
a first transistor coupled between a supply node and the output node;
a second transistor coupled between the first transistor and the output node, the second transistor including a gate to receive the clock signal; and
a third transistor coupled between the output node and a ground node, the third transistor including a gate coupled to the gate of the second transistor to receive the clock signal.

18. The apparatus of claim 17, wherein the first functional unit includes a processing core of a processor, and the second functional unit includes a cache memory of the processor.

19. The apparatus of claim 17, further comprising a connector, the connector conforming with one of Universal Serial Bus (USB), High-Definition Multimedia Interface (HD II), Thunderbolt, Peripheral Component Interconnect Express (PCIe), and Ethernet specifications.

* * * * *